(12) United States Patent
Brockmole et al.

(10) Patent No.: US 11,750,164 B2
(45) Date of Patent: Sep. 5, 2023

(54) CONTROLLED RAIL-VOLTAGE DECAY FOR BOOST POWER SUPPLY OUTPUT PROTECTION

(71) Applicant: Harman International Industries, Incorporated, Stamford, CT (US)

(72) Inventors: Jeffrey Michael Brockmole, Brighton, MI (US); Matthew Ryan Parnell, Livonia, MI (US)

(73) Assignee: Harman International Industries, Incorporated, Stamford, CT (US)

(*) Notice: Subject to any disclaimer, the term of this patent is extended or adjusted under 35 U.S.C. 154(b) by 86 days.

(21) Appl. No.: 16/950,685

(22) Filed: Nov. 17, 2020

(65) Prior Publication Data

US 2022/0158598 A1     May 19, 2022

(51) Int. Cl.
*H03F 1/02*     (2006.01)
*H03G 3/30*     (2006.01)
*H03F 3/183*     (2006.01)
*H03G 5/00*     (2006.01)

(52) U.S. Cl.
CPC .......... *H03G 3/301* (2013.01); *H03F 1/0211* (2013.01); *H03F 3/183* (2013.01); *H03G 5/005* (2013.01); *H03F 2200/03* (2013.01); *H03G 2201/103* (2013.01)

(58) Field of Classification Search
CPC .............. H03G 3/301; H03G 2201/103; H03F 1/0211; H03F 3/183; H03F 2200/03
USPC ...................... 330/278, 251, 207 A
See application file for complete search history.

(56) References Cited

U.S. PATENT DOCUMENTS

| | | | |
|---|---|---|---|
| 7,498,880 B2 * | 3/2009 | Delano ................. | H03F 3/3081 330/251 |
| 9,559,642 B2 | 1/2017 | Olson et al. | |
| 9,571,040 B2 * | 2/2017 | Yamada ................. | H03F 1/025 |
| 10,326,405 B2 | 6/2019 | Galal et al. | |
| 2012/0262232 A1 * | 10/2012 | Sukegawa ............. | H03F 1/3205 330/127 |
| 2014/0210559 A1 | 7/2014 | Mathe et al. | |

* cited by examiner

*Primary Examiner* — Andrea Lindgren Baltzell
*Assistant Examiner* — Khiem D Nguyen
(74) *Attorney, Agent, or Firm* — McCoy Russell LLP (57) ABSTRACT

Methods and systems are provided for controlling rail-voltages for amplifier output stages. In some examples, a method may include receiving sets of data values (e.g., at a power-supply control circuitry) for control of a rail voltage of an amplifier output stage. The method may also include determining that the receipt of a pending set of data values has been interrupted. Then, upon the determination that the receipt of the pending plurality of data values has been interrupted, the method may include decreasing the rail voltage to a non-boosted rail-voltage level.

17 Claims, 6 Drawing Sheets

CONTROLLED RAIL-VOLTAGE DECAY FOR BOOST POWER SUPPLY OUTPUT PROTECTION

FIELD

The disclosure relates to controlling rail voltage amplification for power supply boosting.

BACKGROUND

For boost power supplies (such as for class-H and class-G amplifiers), rail voltage for an output stage may be increased above a main power voltage. In some embodiments, a boost power supply may be used to increase a rail voltage of an amplifier output stage where the rail voltage serves one or more speakers. The rail voltage may be continuously adjusted to provide sufficient power to accommodate the instantaneous volume or magnitude of the sounds made by the speakers, while minimizing unnecessary power draw for the amplification.

Adjustments of the rail voltage for a boost power supply may be controlled by various mixtures of hardware and software (e.g., in order to ensure desirable headroom between the voltage rail and a targeted audio envelope). In some embodiments, a first hardware-based portion of a boost power supply system may supply voltage rails to one or more speakers, while a second hardware-based portion of the system may analyze audio signals to be delivered to the speakers in order to determine optimum instantaneous voltage rail values.

For example, the first portion of the boost power supply system may comprise a power supply controller circuitry, and the second portion may comprise a calculating circuitry to analyze data corresponding with the audio signals to determine optimum instantaneous rail voltages. In some exemplary embodiments, the first portion and the second portion may be distinct hardware components (although their operation may be guided by software). Such boost power supply systems may be designed to communicate the results of the analysis from the second portion to the first portion.

SUMMARY

For boost power supply systems, a power supply controller circuitry (e.g., a first circuitry) may receive data to be used in establishing instantaneous rail voltages, which may be communicated to the power supply controller circuitry by a calculating circuitry (e.g., a second circuitry). However, under some conditions, the transmission and/or receipt of this data may be interrupted. For example, hardware circuitry involved in the calculation may fail, or circuitry involved in an interface for transmitting the data from the calculating circuitry, or circuitry involved in an interface for receiving the data at the power supply controller circuitry may fail. The power supply controller circuitry might then be disposed to supply the most recently-indicated instantaneous rail voltage, which may be at an overly-high level that may cause excessive power to be drawn. The resulting excessive power draws may in turn result in damaged components and systems.

The methods and systems disclosed herein may address interruptions in communications between portions of boost power supply systems, and may thereby protect the systems from undesirable consequences such as excessively high power draw. In some embodiments, a portion of a boost power supply system may be operable to receive sets of data values for control of a rail voltage of an amplifier output stage. The sets of data values may correspond with instantaneous audio volumes over a period of time. The portion of the boost power supply system may be operable to determine than the receipt of a pending set of data values has been interrupted (e.g., a set of data values whose arrival within a time period is expected). Upon the determination that the receipt of the pending set of data values has been interrupted, the portion of the boost power supply system may adjust the rail voltage from a current level to a non-boosted rail-voltage level. In this way, interruption of communication between the portion of the boost power supply system, and another portion that may have calculated the received sets of data values, may advantageously be handled gracefully by the system.

For some embodiments, sets of data values and headers corresponding with the sets of data values may be received, and interruptions in reception of the sets of data values and headers may be detected. When no interruption in reception is detected, a rail voltage of an audio amplifier output stage may be set based upon the sets of received data values. When an interruption in reception is detected, the rail voltage of the audio amplifier output stage may be set to a non-boosted voltage. In this way, the rail voltage of the audio amplifier may advantageously be maintained at non-damaging levels.

In some embodiments, systems for maintaining boosted rail voltages corresponding with an audio amplifier may comprise a first hardware circuitry and a second hardware circuitry. The first hardware circuitry may be operable to control a rail voltage of an audio amplifier output stage, and the second hardware circuitry may be operable to calculate frames of data for use in controlling the rail voltage. The frames of data may include sets of data values and accompanying headers. The first hardware circuitry may further be operable to receive the frames of data from the second hardware circuitry, to set the rail voltage based upon determining that reception of the frames of data is not interrupted (e.g., as in a normal operational mode), and to set the rail voltage to a non-boosted voltage based upon determining that reception of the frames of data has been interrupted. In this way, such systems may advantageously gracefully handle an interruption in receipt of frames of data.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

The disclosure may be better understood from reading the following description of non-limiting embodiments, with reference to the attached drawings, wherein below.

DETAILED DESCRIPTION

Figure 1:
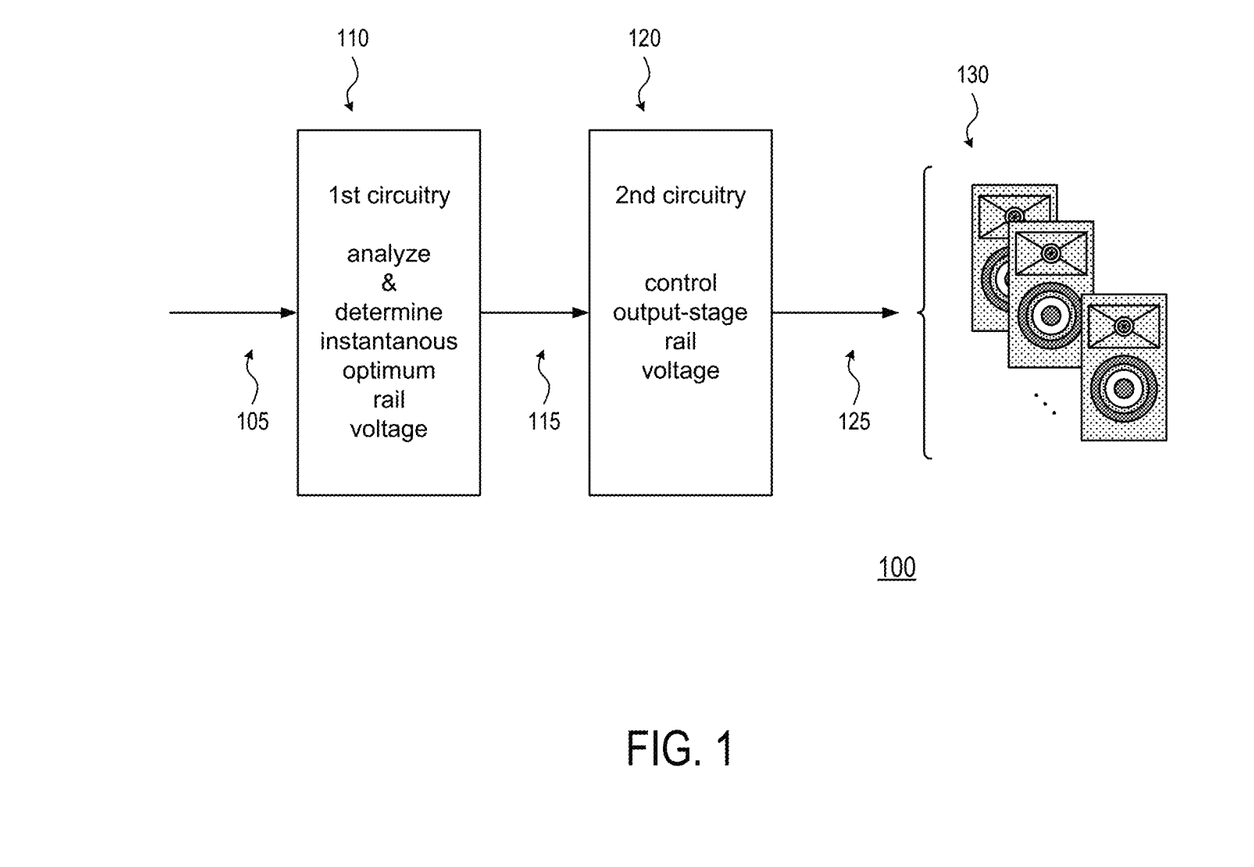
FIG. 1 shows a schematic diagram of portions of a boost power supply system, in accordance with one or more embodiments of the present disclosure.
Figure 2:
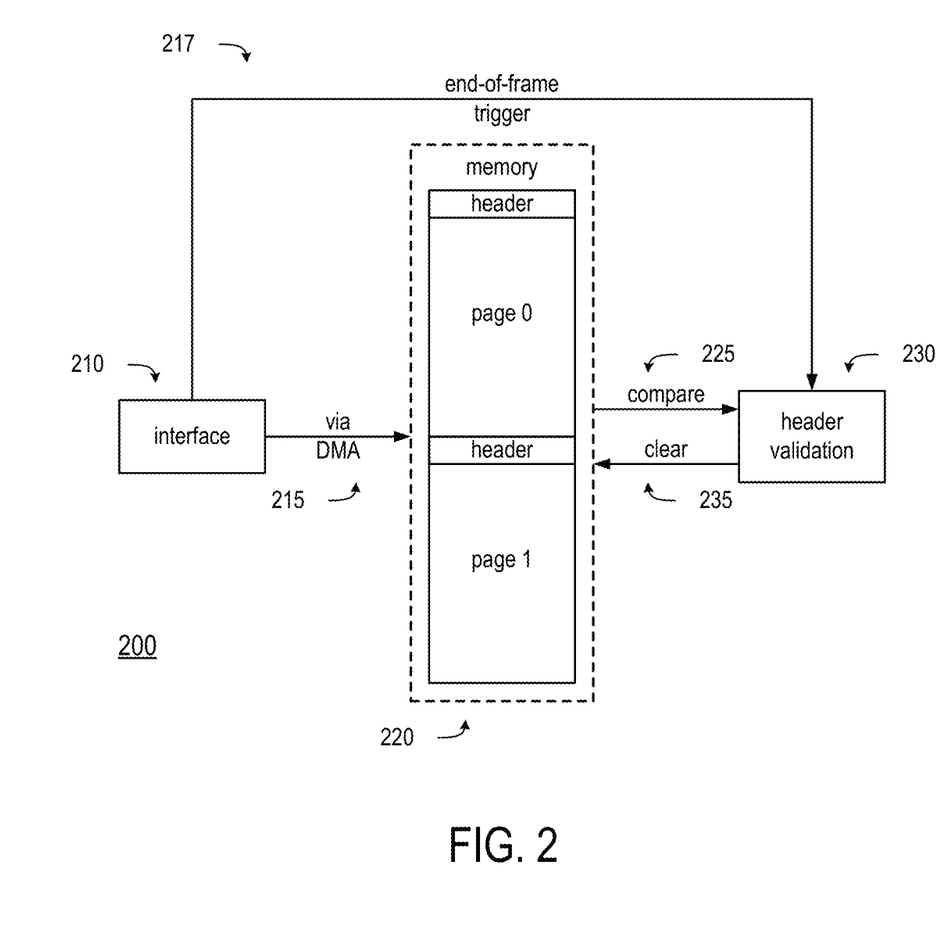
FIG. 2 shows a block diagram of portions of a power supply controller circuitry, in accordance with one or more embodiments of the present disclosure.
Figure 3:
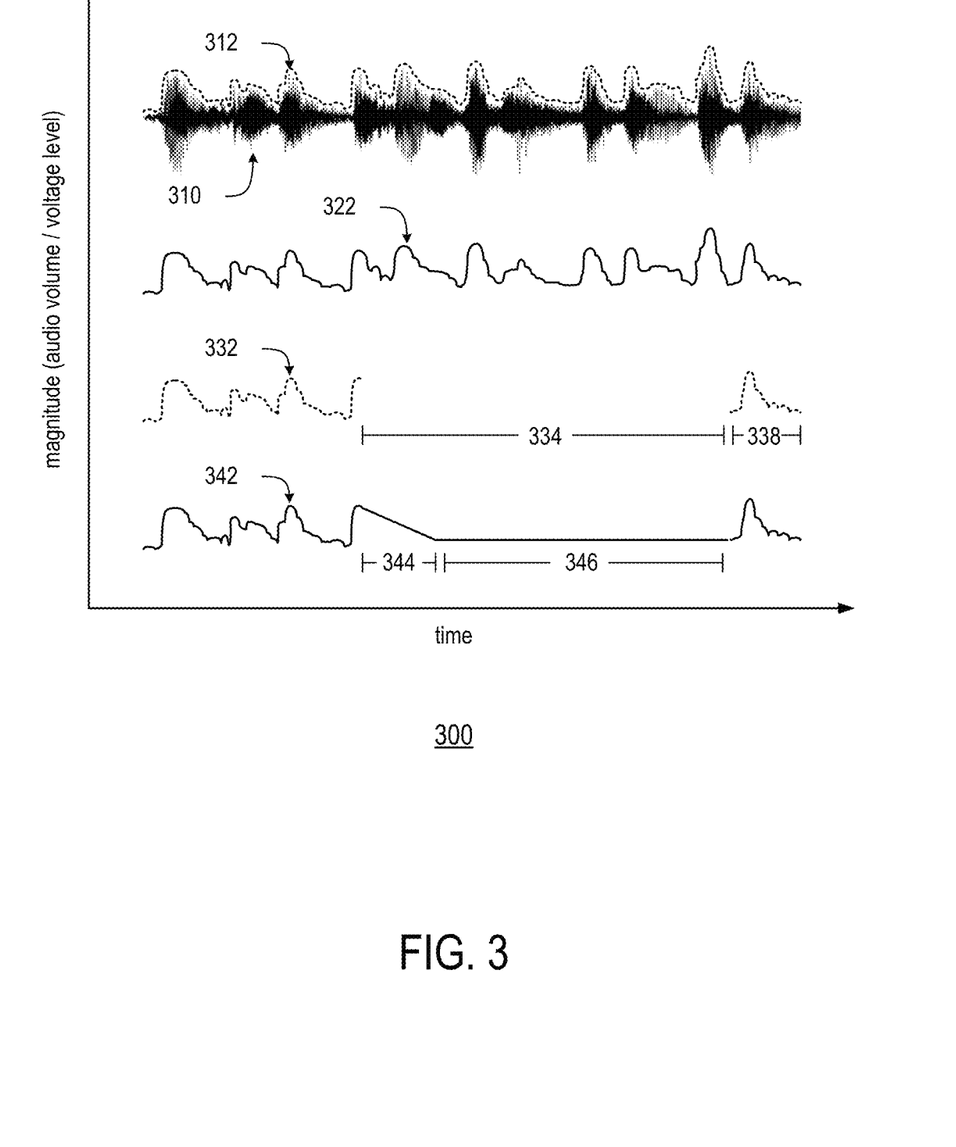
FIG. 3 shows a timing diagram for operation of a boost power supply system in accordance with one or more embodiments of the present disclosure.
Figure 4A:
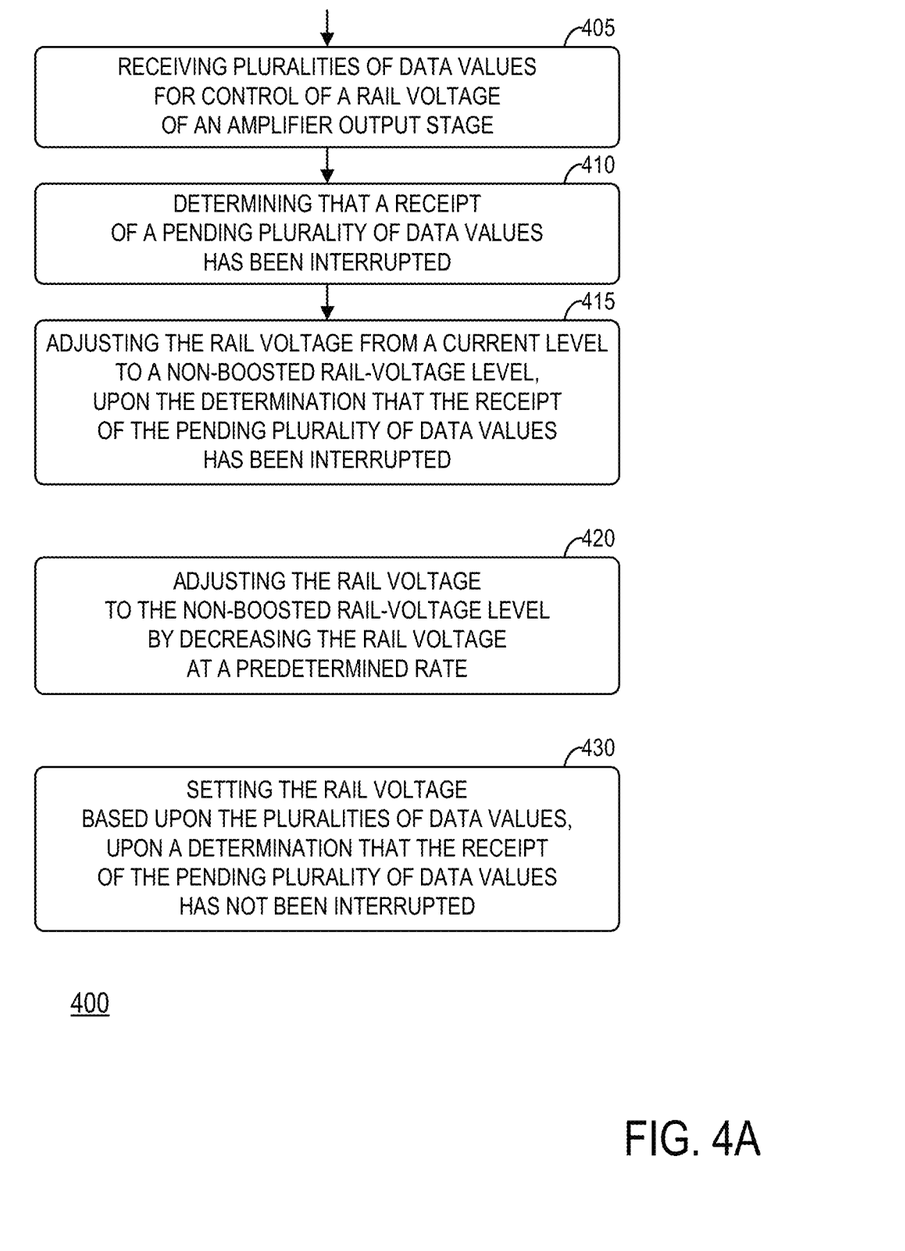
FIGS. 4A and 4B show an example method of controlling rail-voltage for amplifier output stages, in accordance with one or more embodiments of the present disclosure.
Figure 4B:
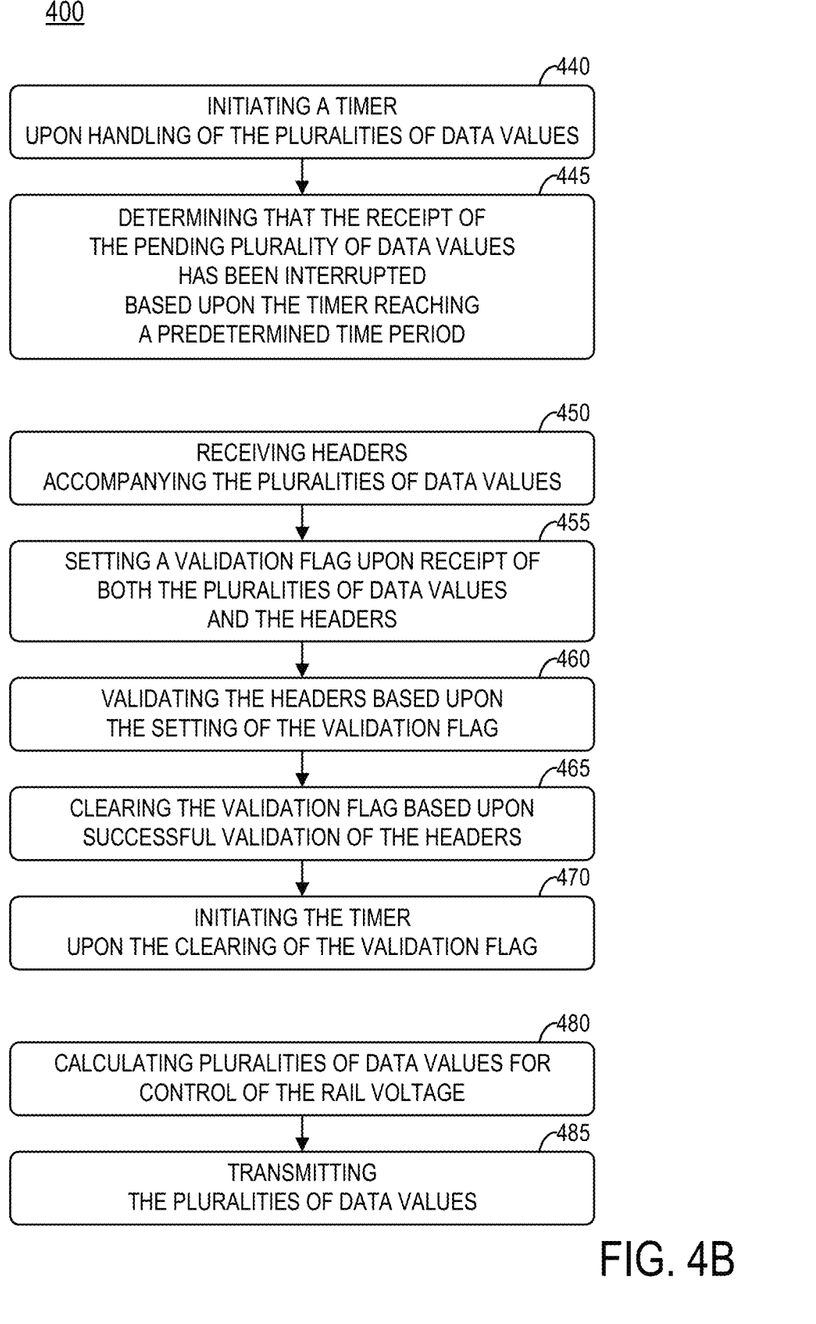
Figure 5:
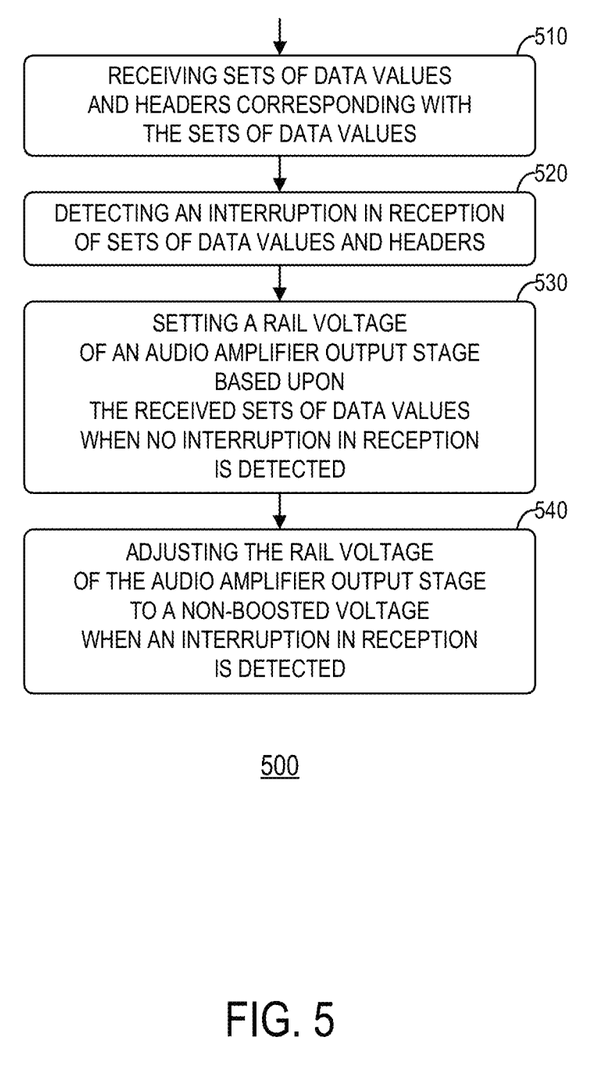
FIG. 5 show an example method of adjusting an amplifier output, in accordance with one or more embodiments of the present disclosure.

Disclosed herein are methods and systems for gracefully handling interruptions in communications between portions of boost power supply systems, and thereby protecting those systems from undesirable power consumption. FIG. 1 schematically depicts portions of a boost power supply system, including circuitries for controlling amplifier output-stage rail voltages and for determining instantaneous optimum rail voltage. FIG. 2 shows portions of a circuitry for controlling amplifier output-stage rail voltages, based upon received data pertaining to instantaneous optimum rail voltages. FIG. 3 shows a timing diagram depicting the behavior of boost power supply systems as discussed herein. FIGS. 4A-4B and 5 show methods of controlling and adjusting amplifier output-stage voltages for boost power supply systems.

FIG. 1 shows portions of a boost power supply system 100, including a first circuitry 110, a second circuitry 120, and amplifier circuitry 130 for one or more speakers. First circuitry 110 may be a power supply controller circuitry, and may be operable to analyze and determine instantaneous optimum rail voltages, e.g., for an amplifier output stage. First circuitry 110 may receive data pertaining to one or more audio signals via an audio data interface 105. In some embodiments, the audio data may, for example, relate to instantaneous volumes of audio signals. For some embodiments, the audio data may contain one or more encoded audio signals, and first circuitry 110 may contain logic for decoding encoded audio signals (e.g., in order to determine instantaneous volumes of the audio signals).

In various embodiments, based on a series of audio data—which may be continuous, instantaneous volumes of audio signals, whether received or decoded via data 105—first circuitry 110 may analyze the audio data to determine continuous, instantaneous output-stage rail voltages to correspond with the audio signals. In some embodiments, first circuitry 110 may perform various calculations in order to establish the output-stage rail voltages. For some embodiments, first circuitry 110 may employ a Digital Signal Processing (DSP) circuitry for calculating output-stage rail voltages.

First circuitry 110 may then transmit the series of rail voltages to second circuitry 120 via a voltage-data interface 115. In some embodiments, voltage-data interface 115 may include a Serial Peripheral Interconnect (SPI) interface. In various embodiments, the series of rail voltages may be transmitted in frames of data comprising a plurality of data values and a header (as discussed further herein). Second circuitry 120, which may be a voltage-rail calculating circuitry, may then use rail voltage data received via voltage-data interface 115 to apply one or more rail voltage signals 125 to amplifier circuitry 130, which may then cause one or more speakers to use a continuous, instantaneously-appropriate degree of power in the amplification of the corresponding audio signals.

In some embodiments, rail voltage signals 125 may themselves have varying voltages (e.g., as analog signals). In other embodiments, rail voltage signals 125 may merely indicate voltage levels for amplifier circuitry 130 to use in amplifying corresponding audio signals (e.g., as digital signals). In various embodiments, software may handle at least part of the establishment of the rail-voltage values and the application of the rail-voltage values to amplifier circuitry 130.

FIG. 2 shows a block diagram of portions of a power supply controller circuitry 200 (which may be substantially similar to power supply controller circuitry 120). Circuitry 200 may comprise voltage-data interface circuitry 210, a memory circuitry 220, and a header validation circuitry 230.

Interface circuitry 210, which may comprise circuitry for an SPI interface, may receive data values corresponding with continuous, instantaneous output-stage rail voltages (such as from a circuitry substantially similar to first circuitry 110). In various embodiments, the data values may be partitioned as frames of data comprising a set of one or more rail-voltage values (e.g., as data values or data samples), and an accompanying header. In some embodiments, there may be a plurality of rail-voltage values per header. For example, in some embodiments, four, or eight, or sixteen, or thirty-two, or sixty-four rail-voltage values may be transferred with an accompanying header in each frame of data. In various embodiments, any number of rail-voltage values may be transferred in each frame of data. (For various embodiments, the rail-voltage values and/or the header may be referred to as data words.)

Interface circuitry 210 may provide the data values to memory circuitry 220 via an interface 215. In some embodiments, memory circuitry 220 may comprise a Random Access Memory (RAM). In various embodiments, memory circuitry 220 may comprise a storage circuitry of any sort, whether a volatile memory circuitry or a non-volatile memory circuitry. Memory circuitry 220 is depicted as having a capacity to store two frames of data (each with a header), but in various embodiments, memory circuitry 220 may have a capacity to merely store one frame of data, or to store more than two frames of data. In some embodiments, the frames of data may be transferred in bulk, in order to arrive in advance of the arrival of the corresponding audio signal (e.g., at one or more corresponding speakers). For various embodiments, frames of data may be transferred to memory circuitry 220 over interface circuitry 210 via a Direct Memory Access (DMA) process.

Meanwhile, interface circuitry 210 may also provide an end-of-frame trigger indicator 217 to header validation circuitry 230. For example, interface circuitry 210 may detect that a final portion of a frame of data has been received, and may then indicate that condition to header validation circuitry 230 by asserting end-of-frame trigger indicator 217. In some embodiments, the assertion of end-of-frame trigger indicator 217 may cause a header-validation flag to be set. In various embodiments, the header-validation flag may be stored in memory 220. In some embodiments, the header-validation flag may be stored as part of the header of the corresponding frame of data, or may be stored along with the corresponding header and/or frame of data in another manner.

Upon detecting an assertion of end-of-frame indicator 217, header validation circuitry 230 may read the corresponding header stored in memory circuitry 220 (e.g., at an expected location or address within memory circuitry 220), via a comparison interface 225, to see whether the header is valid (e.g., by virtue of being successfully compared to an expected header format). If the header is valid, the rail-voltage values stored in memory circuitry 220 with the associated frame of data may also be read out, and then applied to an amplifier circuitry (in a manner substantially similar to the manner in which rail voltage signals 125 may be applied to amplifier circuitry 130). In addition, the header-validation flag may be cleared, which may be signaled by a clearing indicator 235. The clearing of the header-validation flag may then initiate a timer circuitry (e.g., a counter) to measure a predetermined time period.

In instances in which there is an interruption in received rail-voltage values at interface circuitry 210, interface circuitry 210 might not detect that a final portion of a frame of data has been received, and might not assert end-of-frame trigger indicator 217. In turn, the absence of an assertion of end-of-frame trigger indicator 217 might result in a header-validation flag not being set.

If receipt of a frame of data, and/or a header for a frame of data, is not detected within the predetermined time period being measured by the timer circuitry (e.g., in response to the clearing of the most-recently-received header-validation flag), circuitry 200 may determine that there has been an interruption in reception of frames of rail-voltage data, and/or an interruption in communication with a corresponding circuitry for providing data values corresponding with continuous, instantaneous output-stage rail voltages.

Upon determining that reception of data frames has been interrupted, circuitry 200 may adjust a rail voltage for an amplifier circuitry (such as one substantially similar to amplifier circuitry 130) from a current rail-voltage value to a non-boosted rail-voltage value (e.g., a lower rail-voltage value that may be more desirable for the underlying main voltage to stably supply). In some embodiments, the adjustment may occur at a predetermined rate and/or over a predetermined period of time.

Subsequently, if communication is resumed, interface circuitry 210 may again assert end-of-frame trigger indicator 217 and/or set the header-validation flag upon detecting the reception of a frame of data. The clearing of the header-validation flag may then initiate the timer circuitry to measure the predetermined time period again, and circuitry 200 may again set rail voltages for the amplifier circuitry based upon rail-voltage data stored in memory 220 (e.g., in a normal operating mode).

FIG. 3 shows a timing diagram 300 for operation of a boost power supply system (such as the systems partially depicted in FIGS. 1 and 2). An audio signal 310 may be provided to one or more speakers. An audio envelope 312 may encompass the instantaneous volume or magnitude of audio signal 310. In turn, audio envelope 312 may correspond with a voltage envelope 322 of optimum instantaneous rail voltages for an output stage of an amplifier associated with the speakers. In other words, voltage envelope 322 may correspond with rail voltages that may accommodate the instantaneous volume or magnitude of audio signal 310 played through the speakers, while minimizing unnecessary power draw for purposes of the amplification.

A series of voltage values 332 may comprise voltage-rail values derived from voltage envelope 322 (and may thereby correspond with audio envelope 312). Voltage values 332 may be transferred to a first circuitry operable to apply received rail-voltage data to an amplifier circuitry (e.g., a power supply controller circuitry of system 100), and voltage values 332 may be transferred from a second circuitry operable to analyze and determine instantaneous optimal rail voltages (e.g., a voltage-rail calculating circuitry of system 100). In turn, the first circuitry may control rail voltages of an output stage of the amplifier circuitry with a rail-voltage signal 342 corresponding with voltage values 332.

However, within a time period 334, there may be an interruption in the voltage values 332 received by the first circuitry. The first circuitry may detect the interruption, and within a time period 344 (which may be toward the beginning of time period 334), the first circuitry may then adjust the rail-voltage signal 342 to a non-boosted voltage (e.g., at a predetermined rate, or over a predetermined time period). Subsequently, within a time period 346 (which may be toward the end of time period 334), the first circuitry may maintain rail-voltage signal 342 at the non-boosted voltage value.

At a time 338, the first circuitry may again receive voltage values 332, and may again control rail voltages of the output stage of the amplifier circuitry with rail-voltage signal 342 (e.g., in a normal mode of operation).

FIGS. 4A-4B show an example method 400 of controlling rail-voltage for amplifier output stages. Method 400 may comprise a receiving 405, a determining 410, and an adjusting 415. Method 400 may also comprise an adjusting 420, a setting 430, an initiating 440, a determining 445, a receiving 450, a setting 455, a validating 460, a clearing 465, an initiating 470, a calculating 480, and/or a transmitting 485.

In receiving 405, pluralities of data values for control of a rail voltage of an amplifier output stage may be received (for example, by a power-supply controller circuitry). In determining 410, it may be determined that a receipt of a pending plurality of data values has been interrupted (as discussed herein). In adjusting 415, the rail voltage may be adjusted from a current level to a non-boosted rail-voltage level, upon the determination that the receipt of the pending plurality of data values has been interrupted.

In some embodiments, the pluralities of data values may correspond with pluralities of instantaneous audio volumes. For some embodiments, in adjusting 420, the rail voltage may be adjusted to the non-boosted rail-voltage level by decreasing the rail voltage at a predetermined rate and/or over a predetermined time period. In some embodiments, in setting 430, the rail voltage may be set based upon the pluralities of data values, upon a determination that the receipt of the pending plurality of data values has not been interrupted (e.g., in a normal mode of operation).

For some embodiments, in initiating 440, a timer may be initiated upon handling of the pluralities of data values. In some embodiments, in determining 445, it may be determined that the receipt of the pending plurality of data values has been interrupted based upon the timer reaching a predetermined time period. For some embodiments, in receiving 450, headers accompanying the pluralities of data values may be received. In some embodiments, in setting 455, a validation flag may be set upon receipt of both the pluralities of data values and the headers. For some embodiments, in validating 460, the headers may be validated based upon the setting of the validation flag. In some embodiments, in clearing 465, the validation flag may be cleared based upon successful validation of the headers. For some embodiments, in initiating 470, the timer may be initiated upon the clearing of the validation flag.

In some embodiments, the rail voltage may be for a class G amplifier and/or a class H amplifier. For some embodiments, in calculating 480, pluralities of data values for control of the rail voltage may be calculated. In some embodiments, in transmitting 485, the pluralities of data values may be transmitted. In various embodiments, a first hardware component (which may be substantially similar to second circuitry 120) may be operable to set the rail voltage and to adjust the rail voltage, and a second hardware component (which may be substantially similar to first circuitry 110) may be operable to perform the calculating of the pluralities of data values.

For some embodiments, the pluralities of data values may be received over an SPI interface. In some embodiments, the pluralities of data values may be transferred by a DMA process.

FIG. 5 show an example method 500 of adjusting an amplifier output. Method 500 may comprise a receiving 510, a detecting 520, a setting 530, and an adjusting 540 (as discussed herein).

In receiving 510, sets of data values and headers corresponding with the sets of data values may be received (e.g., as with frames of data discussed herein). In detecting 520, an interruption in reception of sets of data values and headers may be detected. In setting 530, a rail voltage of an audio amplifier output stage may be detected based upon the received sets of data values when no interruption in reception is detected. In adjusting 540, the rail voltage of the audio amplifier output stage may be adjusted to a non-boosted voltage when an interruption in reception is detected.

In some embodiments, the rail voltage of the audio amplifier output stage may be adjusted to the non-boosted voltage at a predetermined rate. For some embodiments, the detection of the interruption may be based upon the lapse of a predetermined time period. In some embodiments, the predetermined time period may be initiated upon the validation of a header. For some embodiments, the setting of a validation flag may follow the receiving of the data values and corresponding headers, and the clearing of the validation flag may follow the validation of the headers.

In some embodiments, the rail voltage may be for a class G amplifier and/or a class H amplifier. For some embodiments, the sets of data values may be transferred by a DMA process over an SPI interface.

Methods 400 and 500 may be configured for the operation of the systems disclosed herein. Thus, the same advantages that apply to the systems may apply to the methods.

The description of embodiments has been presented for purposes of illustration and description. Suitable modifications and variations to the embodiments may be performed in light of the above description or may be acquired from practicing the methods. For example, unless otherwise noted, one or more of the described methods may be performed by a suitable device and/or combination of devices. The methods may be performed by executing stored instructions with one or more logic devices (e.g., processors) in combination with one or more additional hardware elements, such as storage devices, memory, image sensors/lens systems, light sensors, hardware network interfaces/antennas, switches, actuators, clock circuits, and so on. The described methods and associated actions may also be performed in various orders in addition to the order described in this application, in parallel, and/or simultaneously.

The description of embodiments has been presented for purposes of illustration and description. Suitable modifications and variations to the embodiments may be performed in light of the above description or may be acquired from practicing the methods. For example, unless otherwise noted, one or more of the described methods may be performed by a suitable device and/or combination of devices, such as the systems described above with respect to FIGS. 1-5. The methods may be performed by executing stored instructions with one or more logic devices (e.g., processors) in combination with one or more additional hardware elements, such as storage devices, memory, image sensors/lens systems, light sensors, hardware network interfaces/antennas, switches, actuators, clock circuits, and so on. The described methods and associated actions may also be performed in various orders in addition to the order described in this application, in parallel, and/or simultaneously. The described systems are exemplary in nature, and may include additional elements and/or omit elements. The subject matter of the present disclosure includes all novel and non-obvious combinations and sub-combinations of the various systems and configurations, and other features, functions, and/or properties disclosed.

In a first approach to the methods and systems discussed herein, a first example of a method comprises: receiving pluralities of data values for control of a rail voltage of an amplifier output stage; determining that a receipt of a pending plurality of data values has been interrupted; and adjusting the rail voltage from a current level to a non-boosted rail-voltage level, upon the determination that the receipt of the pending plurality of data values has been interrupted. In a second example building off of the first example, the pluralities of data values correspond with pluralities of instantaneous audio volumes. In a third example building off of either the first example or the second example, the method comprises: adjusting the rail voltage to the non-boosted rail-voltage level by decreasing the rail voltage at a predetermined rate. In a fourth example building off of any of the first example through the third example, the method comprises: setting the rail voltage based upon the pluralities of data values, upon a determination that the receipt of the pending plurality of data values has not been interrupted. In a fifth example building off of any of the first example through the fourth example, the method comprises: initiating a timer upon handling of the pluralities of data values; and determining that the receipt of the pending plurality of data values has been interrupted based upon the timer reaching a predetermined time period. In a sixth example building off of the fifth example, the method comprises: receiving headers accompanying the pluralities of data values; setting a validation flag upon receipt of both the pluralities of data values and the headers; validating the headers based upon the setting of the validation flag; clearing the validation flag based upon successful validation of the headers; and initiating the timer upon the clearing of the validation flag. In a seventh example building off of any of the first example through the sixth example, the rail voltage is for one of: a class G amplifier, or a class H amplifier. In an eighth example building off of any of the first example through the seventh example, the method comprises: calculating pluralities of data values for control of the rail voltage; and transmitting the pluralities of data values, wherein a first hardware component is operable to set the rail voltage and to adjust the rail voltage; and wherein a second hardware component is operable to perform the calculating of the pluralities of data values. In a ninth example building off of any of the first example through the eighth example, the pluralities of data values are received over an SPI interface; and the pluralities of data values are transferred by a DMA process.

In a second approach to the methods and systems discussed herein, a first example of a method of adjusting an amplifier output comprises: receiving sets of data values and headers corresponding with the sets of data values; detecting an interruption in reception of sets of data values and headers; setting a rail voltage of an audio amplifier output stage based upon the received sets of data values when no interruption in reception is detected; and adjusting the rail voltage of the audio amplifier output stage to a non-boosted voltage when an interruption in reception is detected. In a second example building off of the first example, the rail voltage of the audio amplifier output stage is adjusted to the non-boosted voltage at a predetermined rate. In a third example building off of either the first example or the second example, the detection of the interruption is based upon the lapse of a predetermined time period; and the predetermined time period is initiated upon the validation of a header. In a fourth example building off of the third example, the setting of a validation flag follows the receiving of the data values and corresponding headers; and the clearing of the validation flag follows the validation of the headers. In a fifth example building off of any of the first example through the fourth example, the rail voltage is for one of: a class G amplifier, or a class H amplifier. In a sixth example building off of any of the first example through the fifth example, the sets of data values are transferred by a DMA process over a SPI interface.

In a third approach to the methods and systems discussed herein, a first example of a system for maintaining a boosted rail voltage corresponding with an audio amplifier comprises: a first hardware circuitry operable to control a rail voltage of an audio amplifier output stage; and a second hardware circuitry operable to calculate frames of data for use in controlling the rail voltage, the frames of data including sets of data values and accompanying headers, wherein the first hardware circuitry is operable to receive the frames of data from the second hardware circuitry; wherein the first hardware circuitry is operable to set the rail voltage in accordance with the frames of data based upon determining that reception of the frames of data is uninterrupted; and wherein the first hardware circuitry is operable to adjust the rail voltage to a non-boosted voltage based upon determining that reception of the frames of data has been interrupted. In a second example building off of the first example, the first hardware circuitry includes a power supply controller circuitry; and the second hardware circuitry includes a DSP circuitry. In a third example building off of either the first example or the second example, the first hardware circuitry is operable to set a validation flag upon receipt of a frame of data; the first hardware circuitry is operable to clear the validation flag upon validating the frame of data; and reception of the sets of data values and accompanying headers is determined to be interrupted if an amount of time since a most-recent clearing of the validation flag exceeds a predetermined amount of time. In a fourth example building off of any of the first example through the third example, the rail voltage is for one of: a class G amplifier, or a class H amplifier. In a fifth example building off of any of the first example through the fourth example, the pluralities of data values are received over an SPI interface, through a DMA process.

As used in this application, an element or step recited in the singular and proceeded with the word "a" or "an" should be understood as not excluding plural of said elements or steps, unless such exclusion is stated. Furthermore, references to "one embodiment" or "one example" of the present disclosure are not intended to be interpreted as excluding the existence of additional embodiments that also incorporate the recited features. Terms such as "first," "second," "third," and so on are used merely as labels, and are not intended to impose numerical requirements or a particular positional order on their objects. The following claims particularly point out subject matter from the above disclosure that is regarded as novel and non-obvious.

As used herein, the term "approximately" is construed to mean plus or minus five percent of the range unless otherwise specified.

As used herein, terminology in which "an embodiment," "some embodiments," or "various embodiments" are referenced signify that the associated features, structures, or characteristics being described are in at least some embodiments, but are not necessarily in all embodiments. Moreover, the various appearances of such terminology do not necessarily all refer to the same embodiments. Also, terminology in which elements are presented in a list using "and/or" language means any combination of the listed elements. For example, "A, B, and/or C" may mean any of the following: A alone; B alone; C alone; A and B; A and C; B and C; or A, B, and C.

The following claims particularly point out certain combinations and sub-combinations regarded as novel and non-obvious. These claims may refer to "an" element or "a first" element or the equivalent thereof. Such claims should be understood to include incorporation of one or more such elements, neither requiring nor excluding two or more such elements. Other combinations and sub-combinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

The invention claimed is:

1. A method comprising:
receiving pluralities of data values for control of a rail voltage of an amplifier output stage;
determining that a receipt of a pending plurality of data values has been interrupted; and
adjusting the rail voltage from a current level to a non-boosted rail-voltage level, upon the determination that the receipt of the pending plurality of data values has been interrupted,
wherein the pluralities of data values correspond with pluralities of instantaneous audio volumes;
wherein a voltage envelope of the rail voltage corresponds with an audio envelope that encompasses an instantaneous magnitude of an audio signal of the amplifier output stage; and
wherein the adjustment of the rail voltage from the current level to the non-boosted rail-voltage level is at a predetermined rate, or over a predetermined period of time, or both.

2. The method of claim 1,
wherein the adjustment of the rail voltage from the current level to the non-boosted rail-voltage level is both at a predetermined rate and over a predetermined period of time.

3. The method of claim 1, comprising:
setting the rail voltage based upon the pluralities of data values, upon a determination that the receipt of the pending plurality of data values has not been interrupted.

4. The method of claim 1, comprising:
initiating a timer upon handling of the pluralities of data values; and
determining that the receipt of the pending plurality of data values has been interrupted based upon the timer reaching a predetermined time period.

5. The method of claim 4, comprising:
receiving headers accompanying the pluralities of data values;
setting a validation flag upon receipt of both the pluralities of data values and the headers;
validating the headers based upon the setting of the validation flag;
clearing the validation flag based upon successful validation of the headers; and
initiating the timer upon the clearing of the validation flag.

6. The method of claim 1,
wherein the rail voltage is for one of: a class G amplifier, or a class H amplifier.

7. The method of claim 1, comprising:
calculating pluralities of data values for control of the rail voltage; and
transmitting the pluralities of data values,
wherein a first hardware component is operable to set the rail voltage and to adjust the rail voltage; and
wherein a second hardware component is operable to perform the calculating of the pluralities of data values.

8. The method of claim 1,
wherein the pluralities of data values are received over a Serial Peripheral Interconnect (SPI) interface; and
wherein the pluralities of data values are transferred by a Direct Memory Access (DMA) process.

9. A method of adjusting an amplifier output, the method comprising:
receiving sets of data values and headers corresponding with the sets of data values;
detecting an interruption in reception of sets of data values and headers;
setting a rail voltage of an audio amplifier output stage based upon the received sets of data values when no interruption in reception is detected; and
adjusting the rail voltage of the audio amplifier output stage to a non-boosted voltage when an interruption in reception is detected,
wherein the detection of the interruption is based upon a lapse of a predetermined time period; and
wherein the predetermined time period is initiated upon a validation of a header.

10. The method of claim 9,
wherein the rail voltage of the audio amplifier output stage is adjusted to the non-boosted voltage at a predetermined rate.

11. The method of claim 9,
wherein the setting of a validation flag follows the receiving of the data values and corresponding headers; and
wherein the clearing of the validation flag follows the validation of the headers.

12. The method of claim 9,
wherein the rail voltage is for one of: a class G amplifier, or a class H amplifier.

13. The method of claim 9,
wherein the sets of data values are transferred by a Direct Memory Access (DMA) process over a Serial Peripheral Interconnect (SPI) interface.

14. A system for maintaining a boosted rail voltage corresponding with an audio amplifier, comprising:
a first hardware circuitry operable to control a rail voltage of an audio amplifier output stage; and
a second hardware circuitry operable to calculate frames of data for use in controlling the rail voltage, the frames of data including sets of data values and accompanying headers,
wherein the first hardware circuitry is operable to receive the frames of data from the second hardware circuitry;
wherein the first hardware circuitry is operable to set the rail voltage in accordance with the frames of data based upon determining that reception of the frames of data is uninterrupted;
wherein the first hardware circuitry is operable to adjust the rail voltage to a non-boosted voltage based upon determining that reception of the frames of data has been interrupted;
wherein the first hardware circuitry is operable to set a validation flag upon receipt of a frame of data;
wherein the first hardware circuitry is operable to clear the validation flag upon validating the frame of data; and
wherein reception of the sets of data values and accompanying headers is determined to be interrupted if an amount of time since a most-recent clearing of the validation flag exceeds a predetermined amount of time.

15. The system for maintaining the boosted rail voltage of claim 14,
wherein the first hardware circuitry includes a power supply controller circuitry; and
wherein the second hardware circuitry includes a Digital Signal Processing (DSP) circuitry.

16. The system for maintaining the boosted rail voltage of claim 14,
wherein the rail voltage is for one of: a class G amplifier, or a class H amplifier.

17. The system for maintaining the boosted rail voltage of claim 14,
wherein the sets of data values are received over an SPI interface, through a DMA process.

* * * * *